(12) United States Patent
Hokazono (10) Patent No.: US 7,985,985 B2
(45) Date of Patent: Jul. 26, 2011

(54) SEMICONDUCTOR DEVICE AND METHOD OF FABRICATING THE SAME

(75) Inventor: Akira Hokazono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 12/340,027

(22) Filed: Dec. 19, 2008

(65) Prior Publication Data
US 2009/0166685 A1 Jul. 2, 2009

(30) Foreign Application Priority Data

Dec. 27, 2007 (JP) ................................. 2007-338047

(51) Int. Cl.
*H01L 29/15* (2006.01)
*H01L 29/76* (2006.01)
*H01L 29/94* (2006.01)
(52) U.S. Cl. .......... 257/192; 257/77; 257/369; 257/616; 257/E29.193
(58) Field of Classification Search ............ 257/77, 257/192, 369, 616, E29.193
See application file for complete search history.

(56) References Cited

U.S. PATENT DOCUMENTS

| 6,426,279 | B1 | 7/2002 | Huster et al. | |
| 2009/0140337 | A1* | 6/2009 | Yamazaki | 257/347 |
| 2009/0325358 | A1* | 12/2009 | Koester | 438/306 |

FOREIGN PATENT DOCUMENTS

JP 2000-77654 3/2000

OTHER PUBLICATIONS

T. Ernst, et al., "A new Si:C epitaxial channel nMOSFET architecture with improved drivability and short-channel characteristics", 2003 Symposium on VI SI Technology Digest of Technical Papers, 2003, 2 Pages.

* cited by examiner

*Primary Examiner* — Ngan Ngo
(74) *Attorney, Agent, or Firm* — Oblon, Spivak, McClelland, Maier & Neustadt, L.L.P.

(57) ABSTRACT

A semiconductor device according to one embodiment includes: a semiconductor substrate; a first impurity diffusion suppression layer formed on the semiconductor substrate for suppressing diffusion of a channel impurity; an impurity channel layer formed on the first impurity diffusion suppression layer and containing the channel impurity; a second impurity diffusion suppression layer formed on the impurity channel layer for suppressing diffusion of the channel impurity; a channel layer formed on the second impurity diffusion suppression layer; a gate insulating film formed on the channel layer; and a gate electrode formed on the gate insulating film.

18 Claims, 5 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-338047, filed on Dec. 27, 2007, the entire contents of which are incorporated herein by reference.

BACKGROUND

Enhancement of carrier (electron and hole) mobility is an important factor for high performance of a transistor. Since an impurity present in a channel causes deterioration of the carrier mobility, it is necessary to form a channel region while preventing impurity diffusion into a surface of a silicon substrate. It is thus well known that a channel structure having a steep impurity concentration gradient is desirable to improve transistor characteristics.

Accordingly, there is a method in which a channel structure having a steep impurity concentration gradient is formed by forming a non-doped silicon epitaxial layer after forming an impurity channel layer by ion implantation.

In this structure, an impurity in the impurity channel layer is diffused from the impurity channel layer into the non-doped silicon epitaxial layer, which causes that a channel profile is moderated. Therefore, since a SiC layer suppresses the diffusion of the impurity (e.g., disclosed in JP-A-2000-77654), it is suggested that, after forming an impurity channel layer by ion implantation, an SiC layer is epitaxially grown on the impurity channel layer and a non-doped silicon epitaxial layer is formed thereon (e.g., disclosed in a non-patent literary document of T. Ernst et al. "2003 Symposium on VLSI Technology Digest of Technical Papers" pp. 51-52).

However, in this structure, there is a problem in that junction capacitance and junction leakage are increased since an impurity diffuses downwards from the impurity channel layer and an impurity concentration at an interface between a well region and a high concentration diffusion layer region and an interface between a channel region and the high concentration diffusion layer region is increased.

BRIEF SUMMARY

A semiconductor device according to one embodiment includes: a semiconductor substrate; a first impurity diffusion suppression layer formed on the semiconductor substrate for suppressing diffusion of a channel impurity; an impurity channel layer formed on the first impurity diffusion suppression layer and containing the channel impurity; a second impurity diffusion suppression layer formed on the impurity channel layer for suppressing diffusion of the channel impurity; a channel layer formed on the second impurity diffusion suppression layer; a gate insulating film formed on the channel layer; and a gate electrode formed on the gate insulating film.

A semiconductor device according to another embodiment includes: a semiconductor substrate having an nMOS region and a pMOS region; a lower impurity diffusion suppression layer formed on the semiconductor substrate in the nMOS region for suppressing diffusion of a p-type channel impurity; a first impurity channel layer formed on the lower impurity diffusion suppression layer and containing the p-type channel impurity; a second impurity channel layer formed on the semiconductor substrate in the pMOS region and containing an n-type channel impurity; an upper impurity diffusion suppression layer formed on the first impurity channel layer and comprising a crystal that suppresses diffusion of the p-type channel impurity; a first channel layer formed on the upper impurity diffusion suppression layer; a second channel layer formed on the second impurity channel layer and comprising the crystal; and gate electrodes each formed on the first and second channel layers via gate insulating films.

A method of fabricating a semiconductor device according to another embodiment includes: forming a lower impurity diffusion suppression layer on an nMOS region of a semiconductor substrate for suppressing diffusion of a p-type channel impurity; forming a first impurity channel layer on the lower impurity diffusion suppression layer, the first impurity channel layer containing the p-type channel impurity; forming a second impurity channel layer on a pMOS region of the semiconductor substrate, the second impurity channel layer containing an n-type channel impurity; simultaneously epitaxially growing first and second SiGe crystals on the first and second impurity channel layers, the first and second SiGe crystals suppressing diffusion of the p-type channel impurity; simultaneously epitaxially growing first and second Si crystals on the first and second SiGe crystals; diffusing Ge in the second SiGe crystal into the second Si crystal by heat treatment for forming a third SiGe crystal comprising the Ge-diffused second Si crystal and the second SiGe crystal; and forming gate electrodes each on the first Si crystal and third SiGe crystal via gate insulating films.

DETAILED DESCRIPTION

First to third embodiments will be described in detail hereinafter with reference to the accompany drawings.

First Embodiment

Figure 1:
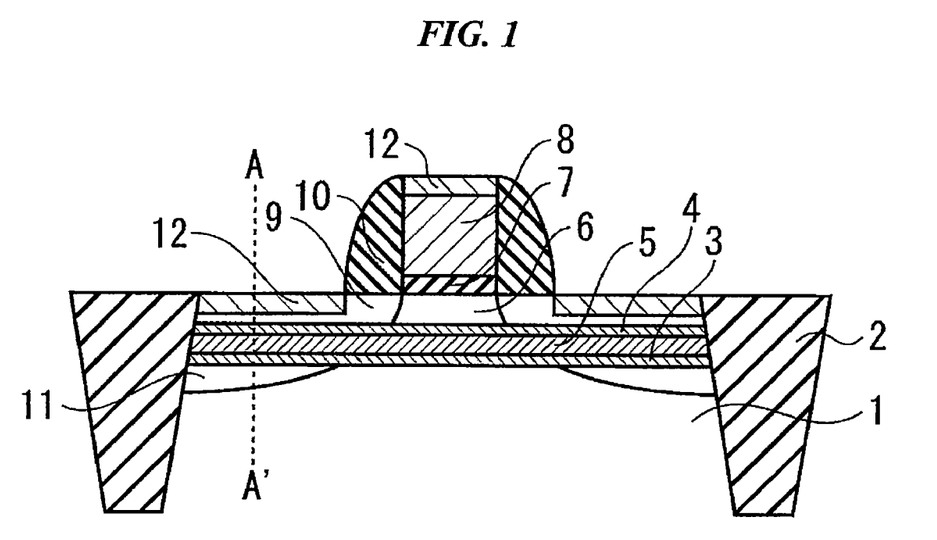
FIG. 1 is a cross sectional view showing a semiconductor device in a first embodiment.

FIG. 1 is a cross sectional view in a channel length direction showing a semiconductor device in a first embodiment.

An element isolation portion 2 having a depth of 200-350 nm is formed on a p-type or n-type silicon substrate 1. A p-type well region (not shown) is formed in an active element portion that is a region on the silicon substrate 1 divided by the element isolation portion 2. In case that the p-type well region is formed by implanting B ion into the silicon substrate 1, a typical implantation condition of B ion for forming the p-type well region is about 260 keV of acceleration voltage and $2\times10^{13}$ cm$^{-2}$ of dosage.

A SiC layer as a first impurity diffusion suppression layer 3 is provided 5-20 nm in thickness in a nMOS region on the silicon substrate 1, and a B-doped or In-doped Si layer as an impurity channel layer 5 are formed 10-30 nm in thickness on the SiC layer 3.

A SiC layer as a second impurity diffusion suppression layer 4 is provided 5-20 nm in thickness on the impurity channel layer 5 and a non-doped silicon epitaxial layer 6 is formed 5-20 nm in thickness on the second impurity diffusion suppression layer 4. By forming the SiC layers as the first impurity diffusion suppression layer 3 and the second impurity diffusion suppression layer 4 so that a carbon atom concentration is $1\times10^{17}$ cm$^{-3}$ or more, it is possible to effectively suppress diffusion of an impurity such as B or In, etc., from the impurity channel layer 5 into the silicon substrate 1 and the silicon epitaxial layer 6. And then, a shallow diffusion layer 9 and a deep diffusion layer 11 are formed spanning any of the silicon epitaxial layer 6, the first impurity diffusion suppression layer 3, the second impurity diffusion suppression layer 4, the impurity channel layer 5 and the silicon substrate 1, or plural layers thereof.

A gate electrode 8 is formed on the silicon epitaxial layer 6 via a gate insulating film 7 and a gate sidewall film 10 is formed on a side surface of a laminate structure composed of the gate insulating film 7 and the gate electrode 8. Then, a silicide layer 12 is formed on the gate electrode 8 and the silicon epitaxial layer 6.

Besides a silicon dioxide film, a silicon oxynitride film or a silicon nitride film, etc., the gate insulating film 7 is formed of, e.g., a hafnium silicon oxynitride film (HfSiON) or a hafnium silicate film (HfSiO), etc., having a permittivity higher than that of the silicon dioxide film or the silicon oxynitride film, or a laminated structure thereof. The gate electrode 8 is composed of, e.g., a conductor such as polysilicon, etc., or a metal electrode such as tungsten (W) or titanium nitride (TiN), etc. The silicide layer 12 may be formed of, e.g., Ni-silicide, Co-silicide, Er-silicide, Pt-silicide or Pd-silicide, etc.

FIGS. 2A to 2E are cross sectional views showing processes for forming the semiconductor device in the first embodiment.

Figure 2A:
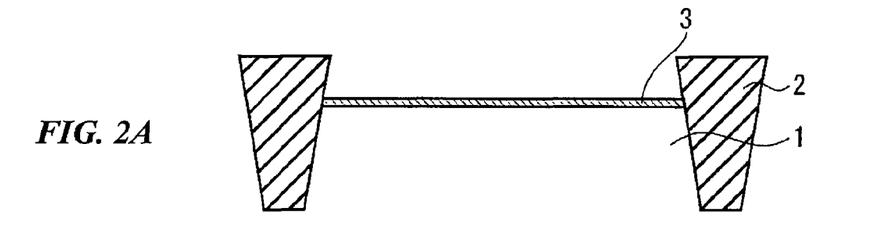
FIGS. 2A to 2E are cross sectional views schematically showing a portion of a method of fabricating the semiconductor device in the first embodiment.

Firstly, the element isolation portion 2 is formed on a main surface of the silicon substrate 1 using, e.g., a hard mask such as SiN, etc.

Next, as shown in FIG. 2A, after forming a well region (not shown) in the active element portion divided by the element isolation portion 2 on the main surface of the silicon substrate 1, a SiC layer as the first impurity diffusion suppression layer 3 is formed on the silicon substrate 1 by epitaxially growing a SiC crystal to a thickness of 5-20 nm.

Silicon is epitaxially grown by heating the silicon substrate 1 in a hydrogen atmosphere at a high temperature of 700° C. or more and supplying reaction gas such as SiH$_4$, SiH$_2$Cl$_2$, SiHCl$_3$ or HCl, etc., on the silicon substrate 1 together with hydrogen, and the SiC layer 3 is formed by supplying the above-mentioned reaction gas mixed with SiH$_3$CH$_3$. It is possible to effectively suppress diffusion of an impurity from the impurity channel layer 5 into the silicon substrate 1 by forming the SiC layer 3 so that an atomic percentage (Atomic %) of carbon is 0.05-3.0%.

Figure 2B:
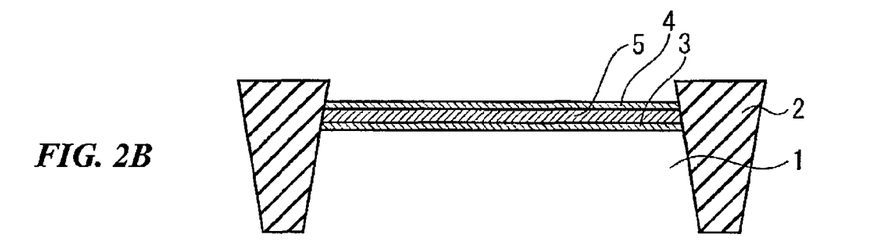

Next, as shown in FIG. 2B, a B-doped or In-doped Si layer, that becomes the impurity channel layer 5, is formed on the SiC layer 3 by epitaxially growing a Si crystal to a thickness of 10-30 nm. It is possible to form the B-doped Si layer 5 by mixing B$_2$H$_6$ with the above-mentioned reaction gas and growing the silicon. After this, a SiC layer as the second impurity diffusion suppression layer 4 is formed on the Si layer 5 by epitaxially growing a SiC crystal.

Figure 2C:
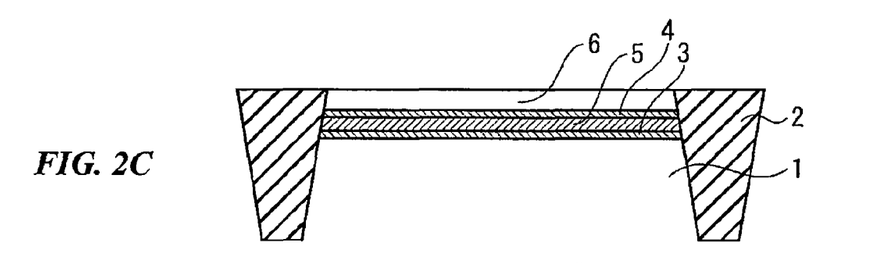

Following this, as shown in FIG. 2C, after a non-doped Si layer used as the silicon epitaxial layer 6, which is a channel layer, is formed 5-20 nm in thickness, RTA (Rapid Thermal Annealing) is conducted for channel activation.

Figure 2D:
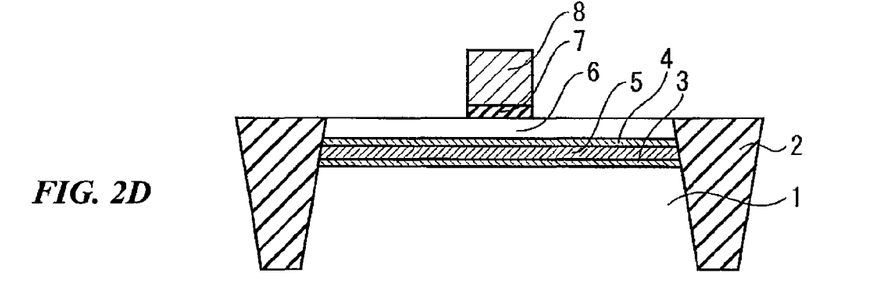

Next, as shown in FIG. 2D, the gate insulating film 7 is formed about 0.5-6 nm in thickness on the silicon epitaxial layer 6 by a thermal oxidation method or a LPCVD (Low Pressure Chemical Vapor Deposition) method. On the gate insulating film 7, an about 50-200 nm thick gate electrode 8 is formed of, e.g., polysilicon or polysilicon germanium. After forming the gate electrode 8, the gate electrode 8 and the gate insulating film 7 are patterned using a lithographic method and a reactive ion etching method, etc.

Next, the shallow diffusion layer 9 is formed by ion implantation. After conducting B ion implantation under the condition of, e.g., 20 keV of acceleration voltage and $1\times10^{13}$-$3\times10^{13}$ cm$^{-2}$ of dosage (30-60 degrees of tilt) as a HALO implantation condition, an As ion is implanted under the condition of 1-5 keV of acceleration voltage and $5\times10^{14}$-$1.5\times10^{15}$ cm$^{-2}$ of dosage, and then, the RTA is conducted for activation.

Following this, the deep diffusion layer 11 is formed by the ion implantation, after forming, e.g., a silicon nitride film as the gate sidewall film 10 on a sidewall of the gate electrode 8 and the gate insulating film 7 using the LPCVD method, etc. The forming condition of the deep diffusion layer 11 is, e.g., the As ion implantation at 5-25 keV of acceleration voltage and $1\times10^5$-$5\times10^{15}$ cm$^{-2}$ of dosage for the n-type diffusion layer.

Figure 2E:
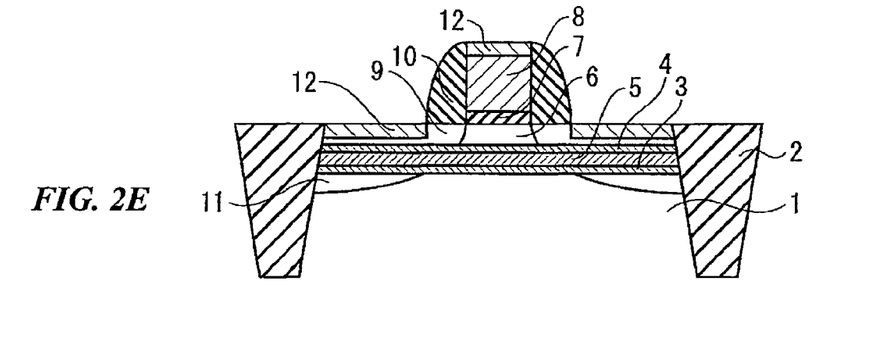

Next, as shown in FIG. 2E, a Ni film is deposited on the silicon substrate 1 and the gate electrode 8 using, e.g., a sputtering method, and the silicon substrate 1 and the gate electrode 8 are silicided by the RTA, which results in that the silicide layer 12 is formed. After forming the silicide layer 12, an unreacted Ni film is removed by etching using a mixed solution of sulfuric acid and hydrogen peroxide water.

Note that, resistance may be further lowered by using a process in which a low-temperature RTA is conducted once at 250-400° C. followed by etching using the mixed solution of sulfuric acid and hydrogen peroxide water, and then, the RTA is conducted once again at 400-500° C. for lowering sheet resistance, or by depositing a TiN film having electrical resistance lower than that of Ni silicide on the Ni film after Ni sputtering.

Figure 3A:
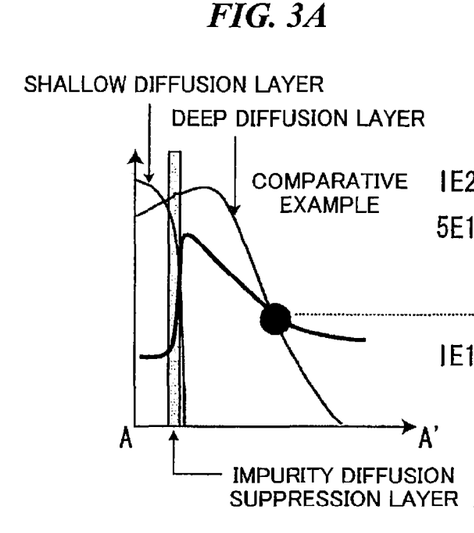
FIGS. 3A and 3B are graphs showing impurity concentrations in the first embodiment.
Figure 3B:
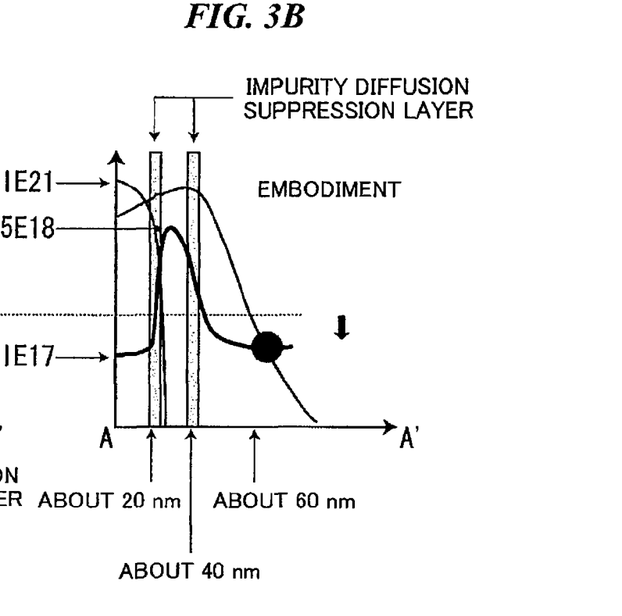

FIG. 3B is a graph showing an impurity concentration at A-A' line of FIG. 1. FIG. 3A is a graph as a comparative example showing an impurity concentration in case that a SiC layer 3 is not formed. As shown in FIGS. 3A and 3B, it was confirmed that an impurity concentration at an interface between the well region and the high concentration diffusion layer region and an interface between the channel region and the high concentration diffusion layer region is suppressed to be low by forming a SiC layer 3 compared with the case in which the SiC layer 3 is not formed.

According to the above embodiment, following effects can be obtained. Namely, by forming impurity diffusion suppression layers 3 and 4 composed of a SiC layer above and below the impurity channel layer 5, it is possible to suppress impurity diffusion in a vertical direction from the impurity channel layer 5 and thus to form a channel structure with a steep impurity concentration profile. In detail, by adjusting the Impurity concentration of the silicon substrate 1 to be $1\times10^{17}$ cm$^{-3}$ or less, it is possible to more effectively form a transistor of which junction capacitance and junction leakage are suppressed.

Second Embodiment

Figure 4:
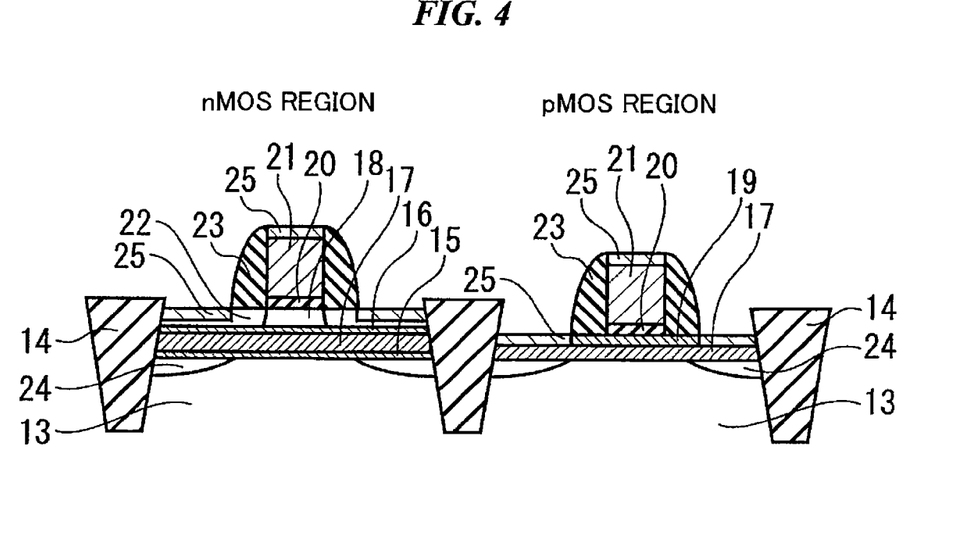
FIG. 4 is a cross sectional view showing a semiconductor device in a second embodiment.

FIG. 4 is a cross sectional view in a channel length direction showing a semiconductor device in a second embodiment.

An element isolation portion 14 having a depth of 200-350 nm is formed on an n-type silicon substrate 13. An n-type well region (not shown) as a pMOSFET forming region (hereinafter referred to as simply "a pMOS region") and a p-type well region (not shown) as an nMOSFET forming region (hereinafter referred to as simply "an nMOS region") are formed in the active element portion that is a region divided by the element isolation portions 14. A typical ion implantation condition for forming the well region is about 500 keV of acceleration voltage and $3 \times 10^{13}$ cm$^{-2}$ of dosage for an n-type well into which a P ion is implanted, and about 260 keV of acceleration voltage and $2 \times 10^{12}$ cm$^{-3}$ of dosage for a p-type well into which a B ion is implanted.

A SiGe layer as a first impurity diffusion suppression layer 15 is provided 5-20 nm in thickness on the silicon substrate 13 in the nMOS region, and an impurity channel layer 17 is formed on the SiGe 15 layer. Meanwhile, the impurity channel layer 17 is formed on the silicon substrate 13 in the pMOS region. An As-doped Si layer in the pMOS region and a B-doped or In-doped Si layer in the nMOS region are each formed 10-30 nm in thickness as the impurity channel layer 17.

A SiGe channel layer 19 is formed on the impurity channel layer 17 in the pMOS region. On the other hand, a SiGe layer as a second impurity diffusion suppression layer 16 is formed on the impurity channel layer 17 in the nMOS region, and a silicon epitaxial layer 18 formed of a non-doped Si crystal formed by an epitaxial growth method is formed on the SiGe layer 16. Gate insulating films 20 are each formed on the SiGe channel layer 19 and the silicon epitaxial layer 18.

By forming the SiGe layers as the first impurity diffusion suppression layer 15 and the second impurity diffusion suppression layer 16 so that a germanium atom concentration is $1 \times 10^{17}$ cm$^{-3}$ or more, it is possible to effectively suppress diffusion of an impurity from the impurity channel layer 17 into the silicon substrate 13 and the silicon epitaxial layer 18. And then, in the pMOS region, a shallow diffusion layer 22 and a deep diffusion layer 24 are formed spanning any of the SiGe channel layer 19, the impurity channel layer 17 and the silicon substrate 13, or plural layers thereof. In the nMOS region, a shallow diffusion layer 22 and a deep diffusion layer 24 are formed spanning any of the silicon epitaxial layer 18, the first and second impurity diffusion suppression layers 15 and 16, the impurity channel layer 17 and the silicon substrate 13, or plural layers thereof.

Then, gate electrodes 21 are formed on the gate insulating films 20 in the pMOS region and the nMOS region, and gate sidewall films 23 are formed on side surfaces of laminate structures of the gate insulating film 20 and the gate electrode 21 in the pMOS region and the nMOS region. And then, silicide layers 25 are formed on the silicon epitaxial layer 18 and the gate electrode 21 in the nMOS region and on the SiGe channel layer 19 and the gate electrode 21 in the pMOS region.

The gate insulating film 20 may be formed of, e.g., a silicon dioxide film, a silicon oxynitride film or a silicon nitride film, etc. The gate electrode 21 is composed of, e.g., a conductor such as polysilicon, etc., or a metal electrode such as tungsten (W) or titanium nitride (TiN), etc. The silicide layer 25 may be formed of, e.g., Ni-silicide, Co-silicide, Er-silicide, Pt-silicide or Pd-silicide, etc.

FIGS. 5A to 5E are cross sectional views showing processes for forming the semiconductor device in the second embodiment.

Figure 5A:
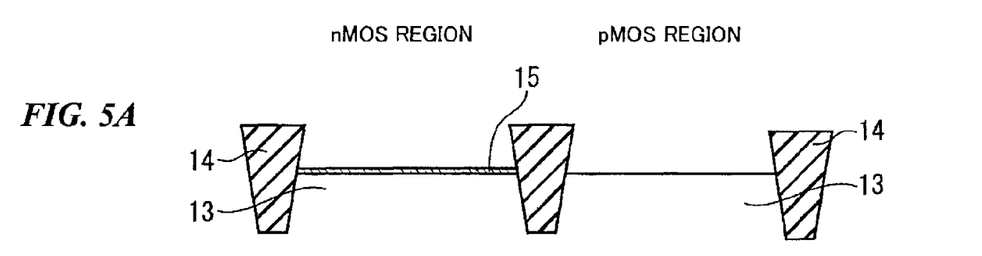
FIGS. 5A to 5E are cross sectional views schematically showing a portion of a method of fabricating the semiconductor device in the second embodiment.

Firstly, the element isolation portion 14 is formed on a main surface of the silicon substrate 13 by a known method using, e.g., a hard mask such as SiN, etc.

Next, as shown in FIG. 5A, a p-type well (not shown) is formed in the nMOS region portions 14 and an n-type well (not shown) is formed in the pMOS region isolated from the nMOS region by the element isolation. Following this, a SiGe layer as the first impurity diffusion suppression layer 15 is formed in the nMOS region by epitaxially growing a SiGe crystal to a thickness of 5-20 nm. It is possible to effectively suppress diffusion of B or In atoms by forming the SiGe layer 15 so that an atomic percentage (Atomic %) of germanium is 1.0-30.0%. The epitaxial growth method is same as that of the first embodiment, hence, the explanation for the overlapped points is omitted in this embodiment.

Figure 5B:
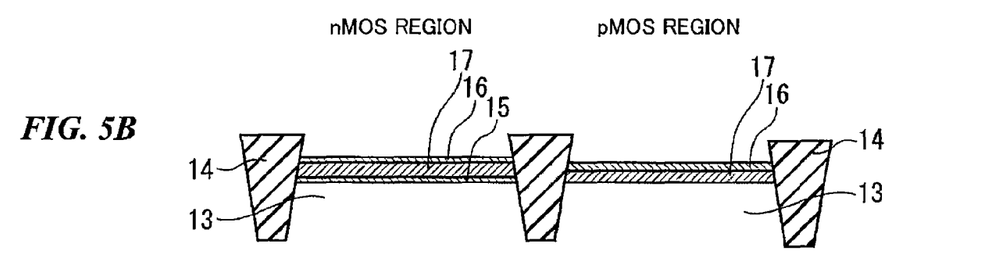

Next, as shown in FIG. 5B, an As-doped Si layer and a B-doped or In-doped Si layers are each formed 10-30 nm in thickness as the impurity channel layer 17 on the silicon substrate 13 in the pMOS region and on the first impurity diffusion suppression layer 15 in the nMOS region. After that, SiGe layers as the second impurity diffusion suppression layer 16 to suppress the diffusion of B or In, etc., are formed on the impurity channel layers 17 in the pMOS region and the nMOS region by epitaxially growing a SiGe crystal.

Figure 5C:
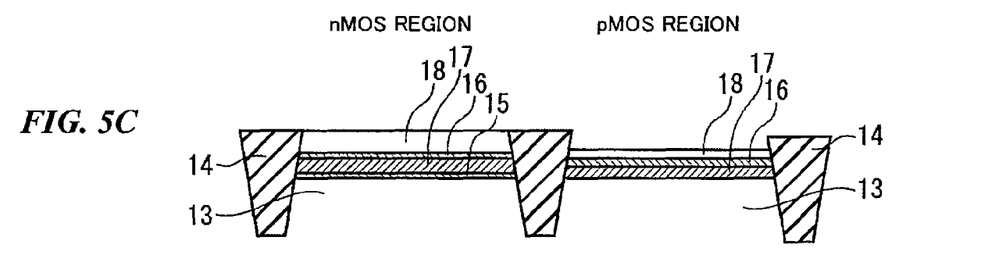

Following this, as shown in FIG. 5C, non-doped Si layers used as the silicon epitaxial layer 18, that is a channel layer, are each formed about 1-5 nm in thickness on the second impurity diffusion suppression layer 16 in the pMOS region and about 10-15 nm in thickness on the second impurity diffusion suppression layer 16 in the nMOS region. Although the SiGe layer can suppress diffusion of B or In in the impurity channel layer 17 in the nMOS region, the effect to suppress the diffusion of As in the impurity channel layer 17 in the pMOS region cannot be expected. However, by using the second impurity diffusion suppression layer 16 in the pMOS region as a channel layer of a pMOSFET, it is possible to improve characteristics of the pMOSFET and to simplify the processes. A process in which the second impurity diffusion suppression layer 16 in the pMOS region is used as a channel layer of a pMOSFET, is shown below.

Ge in the second impurity diffusion suppression layer 16 is diffused into the silicon epitaxial layer 18 by heat, etc., which is applied after forming the channel region. Since the silicon epitaxial layer 18 in the pMOS region is shallower than the silicon epitaxial layer 18 in the nMOS region, the entire silicon epitaxial layer 18 in the pMOS region becomes a SiGe layer due to the diffusion of the Ge from the second impurity diffusion suppression layer 16, and the SiGe channel layer 19 composed of the second impurity diffusion suppression layer 16 and the Ge-diffused silicon epitaxial layer 18 is obtained.

Figure 5D:
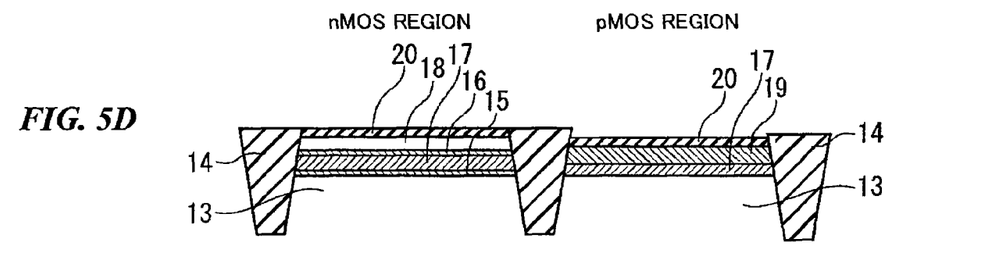

As shown in FIG. 5D, a surface of the silicon epitaxial layer 18 is oxidized by a thermal oxidation method or a radical oxidation method, which results in that the gate insulating film 20 is formed.

Following this, on the gate insulating films 20 in the pMOS region and the nMOS region, the about 50-200 nm thick gate electrodes 21 are each formed of, e.g., polysilicon or polysilicon germanium. After forming the gate electrodes 21, the gate insulating films 20 and the gate electrodes 21 are patterned using a lithographic method or a reactive ion etching method, etc.

Next, the shallow diffusion layers 22 are each formed in the nMOS region and in the pMOS region by ion implantation. When the shallow diffusion layers 22 is an n-type diffusion layer, after conducting B ion implantation under the condition of, e.g., 20 keV of acceleration voltage and $1 \times 10^{13}$-$3 \times 10^{13}$ cm$^{-2}$ of dosage (30-60 degrees of tilt) as a HALO implantation condition, an As ion is implanted under the condition of 1-5 keV of acceleration voltage and $5 \times 10^{14}$-$1.5 \times 10^{15}$ cm$^{-2}$ of dosage. On the other hand, when the shallow diffusion layers 22 is a p-type diffusion layer, after conducting As ion implantation under the condition of, e.g., 40 keV of acceleration voltage and $1\times10^{13}$-$3\times10^{13}$ cm$^{-2}$ of dosage (30-60 degrees of tilt) as a HALO implantation condition, a B ion is implanted under the condition of 1-3 keV of acceleration voltage and $5\times10^{14}$-$1.5\times10^{15}$ cm$^{-2}$ of dosage, and then, the RTA is conducted for activation.

Note that, resistance may be further lowered by using a process in which a low-temperature RTA is conducted once at 250-400° C. followed by etching using the mixed solution of sulfuric acid and hydrogen peroxide water, and then, the RTA is conducted once again at 400-500° C. for lowering sheet resistance, or by depositing a TiN film having electrical resistance lower than that of Ni silicide on the Ni film after Ni sputtering.

Figure 5E:
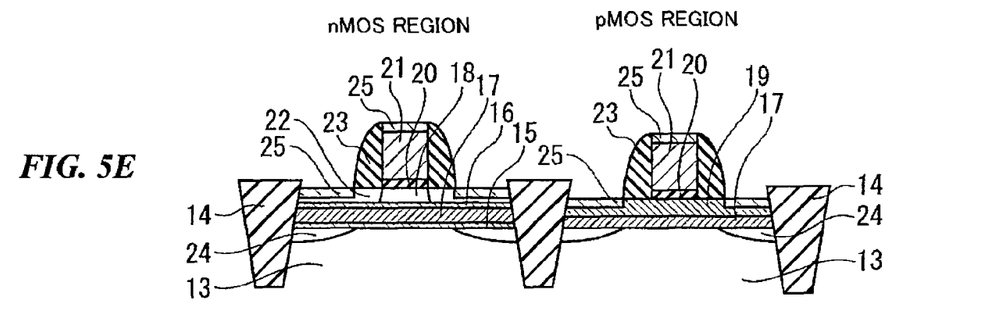

Following this, as shown in FIG. 5E, as the gate sidewall film 23, for example, silicon dioxide films are each formed on sidewalls of the gate electrode 21 and the gate insulating film 20 in the nMOS region and in the pMOS region using the LPCVD method, etc. After forming the gate sidewall film 23, the deep diffusion layer 24 is formed by, e.g., a B ion implantation at 1-5 keV of acceleration voltage and $5\times10^{14}$-$5\times10^{15}$ cm$^{-2}$ of dosage in the pMOS region, and by an As ion implantation at 5-25 keV of acceleration voltage and $1\times10^{15}$-$5\times10^{15}$ cm$^{-2}$ of dosage in the nMOS region.

Next, Ni films are each deposited on the silicon substrate 13 and the gate electrode 21 in the nMOS region and in the pMOS region using, e.g., a sputtering method, and the silicon substrate 13 and the gate electrode 21 are silicided by the RTA, which results in that the silicide layer 25 is formed. After forming the silicide layer 25, an unreacted Ni film is removed by etching using a mixed solution of sulfuric acid and hydrogen peroxide water.

According to the above embodiment, following effects can be obtained. Namely, by forming impurity diffusion suppression layers composed of a SiGe layer above and below the impurity channel layer 17 in the nMOS region, it is possible to form a steep channel structure in which impurity diffusion in a vertical direction from the impurity channel layer is suppressed. In detail, by adjusting the impurity concentration of the silicon substrate 1 to be $1\times10^{17}$ cm$^{-3}$ or less, it is possible to more effectively form a transistor of which junction capacitance and junction leakage are suppressed. In addition, it is possible to simplify the processes by simultaneously forming the impurity diffusion suppression layer in the nMOS region and a SiGe channel layer in the pMOS region.

Third Embodiment

Next, a method of fabricating a semiconductor device in the third embodiment will be explained. In this embodiment, when an impurity channel layer is formed, instead of an impurity doped epitaxial growth in the first or second embodiment, a method, in which a non-doped silicon epitaxial layer is grown and an impurity is introduced into the non-doped silicon epitaxial layer by the ion implantation, is used. Note that, RTA for activation is conducted after the ion implantation. Since the other fabrication processes and a material and a structure of the film are same as the first and second embodiment, the explanation for the overlapped points is omitted here.

When an impurity is introduced into the silicon epitaxial layer of the impurity channel layer by using the ion implantation in the embodiment, it is desirable to adjust an impurity ion range by controlling an acceleration energy so that the impurity ion reaches the impurity channel layer.

According to the above embodiment, following effects can be obtained. Namely, it is possible to form a steep channel structure similar to that of the first and second embodiments, in which the impurity diffusion in a downward direction from the impurity channel layer is suppressed. In detail, by adjusting the impurity concentration of the silicon substrate 1 to be $1\times10^{17}$ cm$^{-3}$ or less, it is possible to more effectively form a transistor of which junction capacitance and junction leakage are suppressed.

What is claimed is:

1. A semiconductor device, comprising:
   a semiconductor substrate;
   a first impurity diffusion suppression layer formed on the semiconductor substrate for suppressing diffusion of a channel impurity;
   an impurity channel layer formed on the first impurity diffusion suppression layer and containing the channel impurity;
   a second impurity diffusion suppression layer formed on the impurity channel layer for suppressing diffusion of the channel impurity;
   a channel layer formed on the second impurity diffusion suppression layer; and
   a gate electrode formed on a gate insulating film on the channel layer,
   wherein the channel impurity is B; and
   the semiconductor device is an n-type transistor.

2. The semiconductor device according to claim 1, wherein the first and second impurity diffusion suppression layers comprise a SiC crystal.

3. The semiconductor device according to claim 2, wherein C concentrations of the first and second impurity diffusion suppression layers are $1\times10^{17}$ cm$^{-3}$ or more.

4. The semiconductor device according to claim 2, wherein C concentrations of the first and second impurity diffusion suppression layers are 0.05 at % or more and 3.0 at % or less.

5. The semiconductor device according to claim 2, wherein the SiC crystal is an epitaxially grown crystal.

6. The semiconductor device according to claim 1, wherein the first and second impurity diffusion suppression layers comprise a SiGe crystal.

7. The semiconductor device according to claim 6, wherein Ge concentrations of the first and second impurity diffusion suppression layers are $1\times10^{17}$ cm$^{-3}$ or more.

8. The semiconductor device according to claim 6, wherein the SiGe crystal is an epitaxially grown crystal.

9. The semiconductor device according to claim 1, wherein the impurity channel layer comprises a Si crystal containing the channel impurity.

10. The semiconductor device according to claim 1, further comprising, a source region and drain region formed in the channel layer, second impurity diffusion suppression layer, impurity channel layer and first impurity diffusion suppression layer, so as to sandwich the gate electrode.

11. The semiconductor device according to claim 10, wherein the source region and drain region are also formed in the semiconductor substrate.

12. A semiconductor device, comprising:
   a semiconductor substrate having an nMOS region and a pMOS region;
   a lower impurity diffusion suppression layer formed on the semiconductor substrate in the nMOS region for suppressing diffusion of a p-type channel impurity;
   a first impurity channel layer formed on the lower impurity diffusion suppression layer in the nMOS region and containing the p-type channel impurity;

a second impurity channel layer formed on the semiconductor substrate in the pMOS region and containing an n-type channel impurity;

an upper impurity diffusion suppression layer formed on the first impurity channel layer in the nMOS region and comprising a crystal that suppresses diffusion of the p-type channel impurity in the nMOS region;

a first channel layer formed on the upper impurity diffusion suppression layer;

a second channel layer formed on the second impurity channel layer in the pMOS region and comprising the crystal; and gate electrodes each formed on the first and second channel layers via gate insulating films.

13. The semiconductor device according to claim 12, wherein the crystal is a SiGe crystal.

14. The semiconductor device according to claim 13, wherein the SiGe crystal is an epitaxially grown crystal.

15. The semiconductor device according to claim 13, wherein a Ge concentration of the SiGe crystal is 10 at % or more and 30 at % or less.

16. The semiconductor device according to claim 12, wherein the first channel layer comprises a Si crystal.

17. The semiconductor device according to claim 12, further comprising:

a first source region and first drain region formed, in the nMOS region, in the first channel layer, upper impurity diffusion suppression layer, first impurity channel layer, and lower impurity diffusion suppression layer; and a second source region and second drain region formed, in the pMOS region, in the second channel layer and second impurity channel layer.

18. The semiconductor device according to claim 17, wherein the first source region and drain region, and the second source region and drain region are also formed in the semiconductor substrate.

* * * * *